(12) United States Patent
Douglas et al.

(10) Patent No.: US 10,215,799 B2
(45) Date of Patent: Feb. 26, 2019

(54) DIAGNOSITC CIRCUITRY FOR POWERED SENSOR MULTIPLE UNIQUE FAULTS DIAGNOSTICS AND RESISTIVE FAULT TOLERANT INTERFACE TO MICROPROCESSOR

(71) Applicant: MAGNA ELECTRONICS INC., Auburn Hills, MI (US)

(72) Inventors: Roger T. Douglas, Waterford, MI (US); Qi Tao, Canton, MI (US)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 8 days.

(21) Appl. No.: 15/405,636

(22) Filed: Jan. 13, 2017

(65) Prior Publication Data

US 2017/0234923 A1 Aug. 17, 2017

Related U.S. Application Data

(60) Provisional application No. 62/431,563, filed on Dec. 8, 2016, provisional application No. 62/408,952, filed on Oct. 17, 2016, provisional application No. 62/295,572, filed on Feb. 16, 2016.

(51) Int. Cl.
*G01R 31/28* (2006.01)
*G01D 3/08* (2006.01)
*G01R 31/02* (2006.01)

(52) U.S. Cl.
CPC .......... *G01R 31/2829* (2013.01); *G01D 3/08* (2013.01); *G01R 31/021* (2013.01); *G01R 31/025* (2013.01); *G01R 31/026* (2013.01)

(58) Field of Classification Search
CPC .......................... G01R 31/2829; G01R 31/041
See application file for complete search history.

(56) References Cited

U.S. PATENT DOCUMENTS

| 2007/0297749 A1* | 12/2007 | Ain | H04B 10/0731 |
| | | | 385/147 |
| 2008/0315865 A1* | 12/2008 | Doogue | G01D 5/145 |
| | | | 324/173 |
| 2009/0323232 A1* | 12/2009 | Suzuki | H02M 1/32 |
| | | | 361/23 |

(Continued)

*Primary Examiner* — Jermele M Hollington
*Assistant Examiner* — Feba Pothen
(74) *Attorney, Agent, or Firm* — Honigman LLP

(57) ABSTRACT

A sensing system includes circuitry having a diagnostic interface for a powered sensor. Responsive to sensing signals, the circuitry is operable to produce a DC level that is defined by operating or fault conditions. The fault conditions include an open voltage supply, an open sensor power return signal, open communication signal(s), series resistance in a communication signal, fault resistance to ground on the communication signal and fault resistance to a voltage source on the communication signal. The circuitry includes a fault tolerant interface between a wire harness at an output of the powered sensor and a digital input port of a microprocessor for the purpose of un-ambiguous fault detection when distortion of sensor information occurs or when loss of sensor information occurs, and wherein the microprocessor diagnoses a fault as defined by the DC level of the analog signal monitored at the communication signal input to the microprocessor.

19 Claims, 11 Drawing Sheets

(56) References Cited

U.S. PATENT DOCUMENTS

| | | | |
|---|---|---|---|
| 2010/0045268 A1* | 2/2010 | Kilian | H03K 19/18 |
| | | | 324/207.2 |
| 2013/0154660 A1* | 6/2013 | Bucsa | H02H 3/087 |
| | | | 324/509 |
| 2015/0039913 A1* | 2/2015 | Sugiyama | G06F 1/28 |
| | | | 713/300 |
| 2016/0245869 A1* | 8/2016 | Asako | G01D 5/2073 |

* cited by examiner

DIAGNOSITC CIRCUITRY FOR POWERED SENSOR MULTIPLE UNIQUE FAULTS DIAGNOSTICS AND RESISTIVE FAULT TOLERANT INTERFACE TO MICROPROCESSOR

CROSS REFERENCE TO RELATED APPLICATIONS

The present application claims the filing benefits of U.S. provisional applications, Ser. No. 62/431,563, filed Dec. 8, 2016; Ser. No. 62/408,952, filed Oct. 17, 2016, and Ser. No. 62/295,572, filed Feb. 16, 2016, which are hereby incorporated herein by reference in their entireties.

SUMMARY OF THE INVENTION

The present invention provides a diagnostic interface for powered sensors external to the controller of a machine system or subsystem. The present invention provides a system and diagnostic circuits that can diagnose open wire connections to the sensor on power, signal(s) and return. The system can also diagnose series resistance on a signal wire, and can diagnose resistance to ground on a signal wire, and can diagnose resistance to voltage source on a signal wire. Also, the digital interface portion of the circuit is designed to be fault tolerant to the point where the fault is un-mistakably identifiable.

These and other objects, advantages, purposes and features of the present invention will become apparent upon review of the following specification in conjunction with the drawings.

DESCRIPTION OF THE PREFERRED EMBODIMENTS

Figure 3:
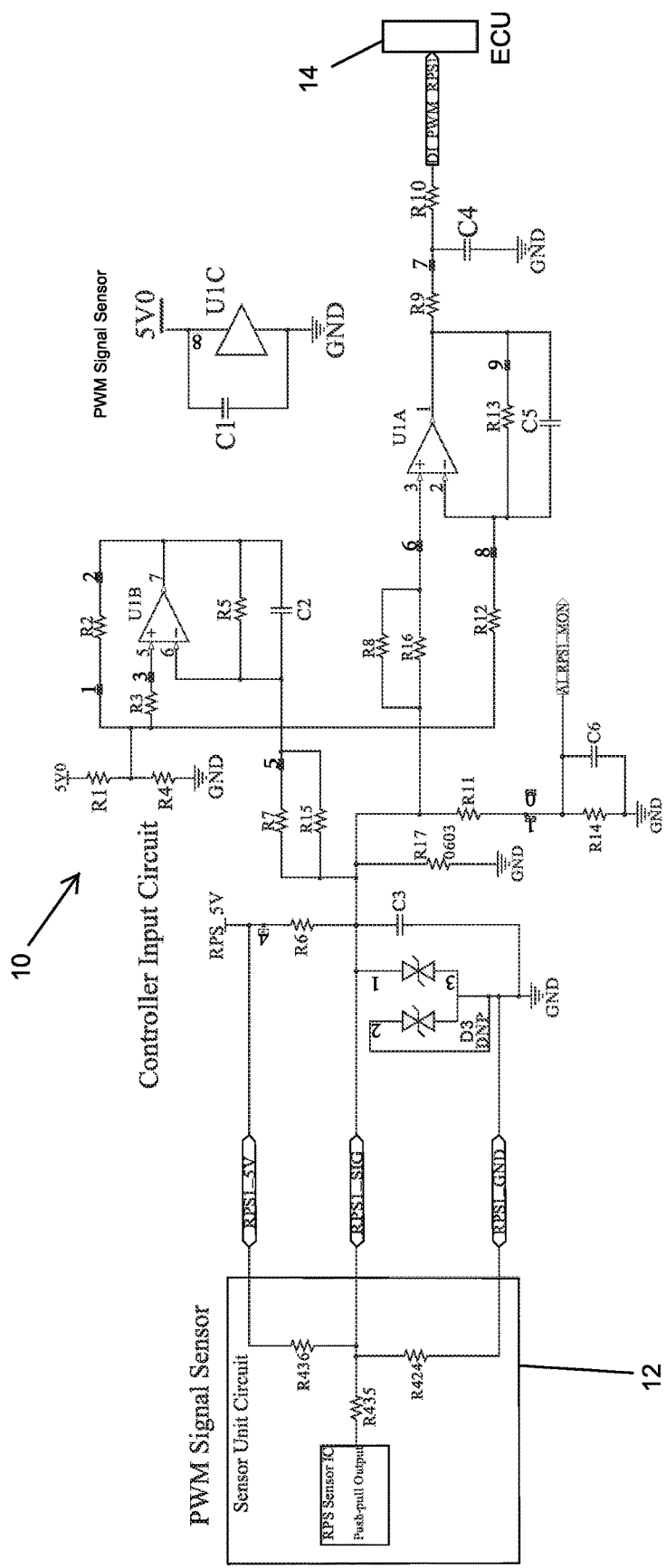
FIG. 3 is another schematic showing a circuit of the present invention, showing a sensor circuit with a PWM or encoded serial data sensor signal using a push-pull output circuit.
Figure 4:
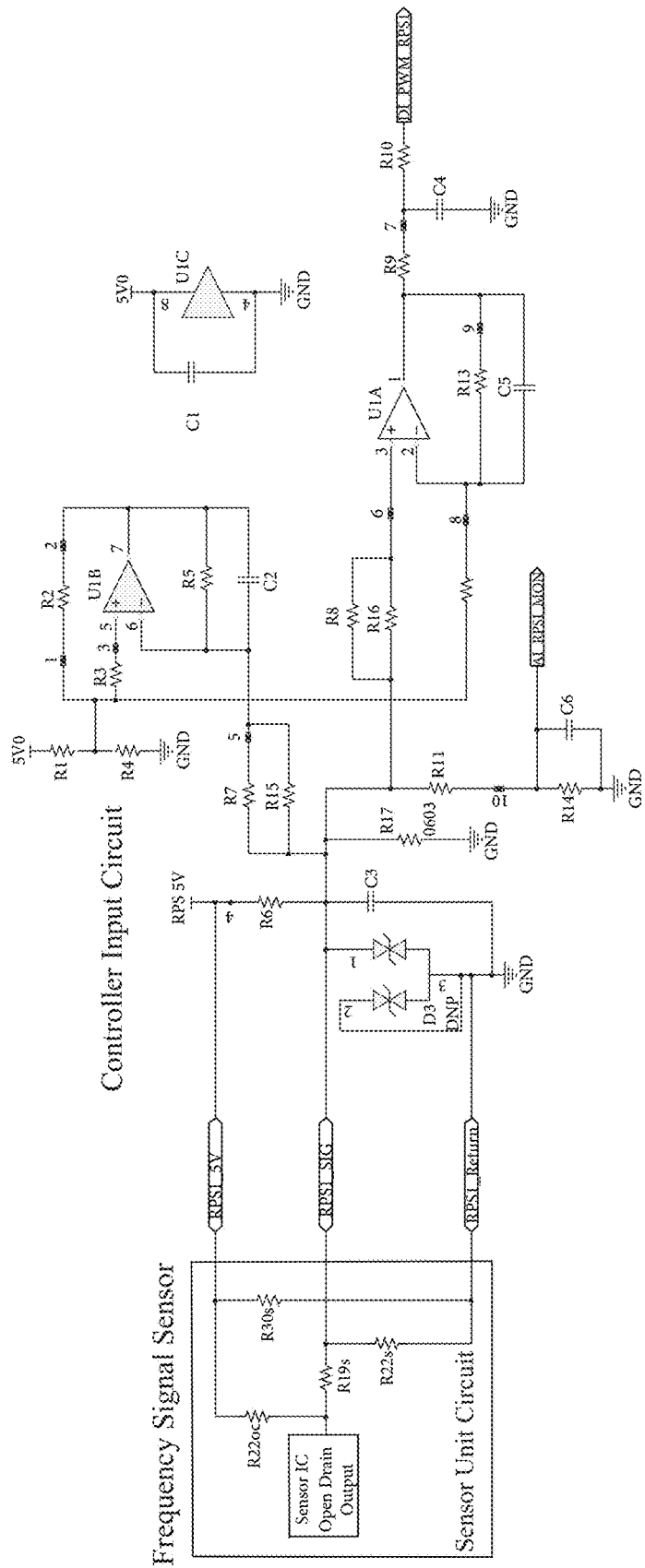
FIG. 4 is another schematic showing a circuit of the present invention, showing an open collector/drain sensor circuit with a PWM signal sensor.
Figure 5:
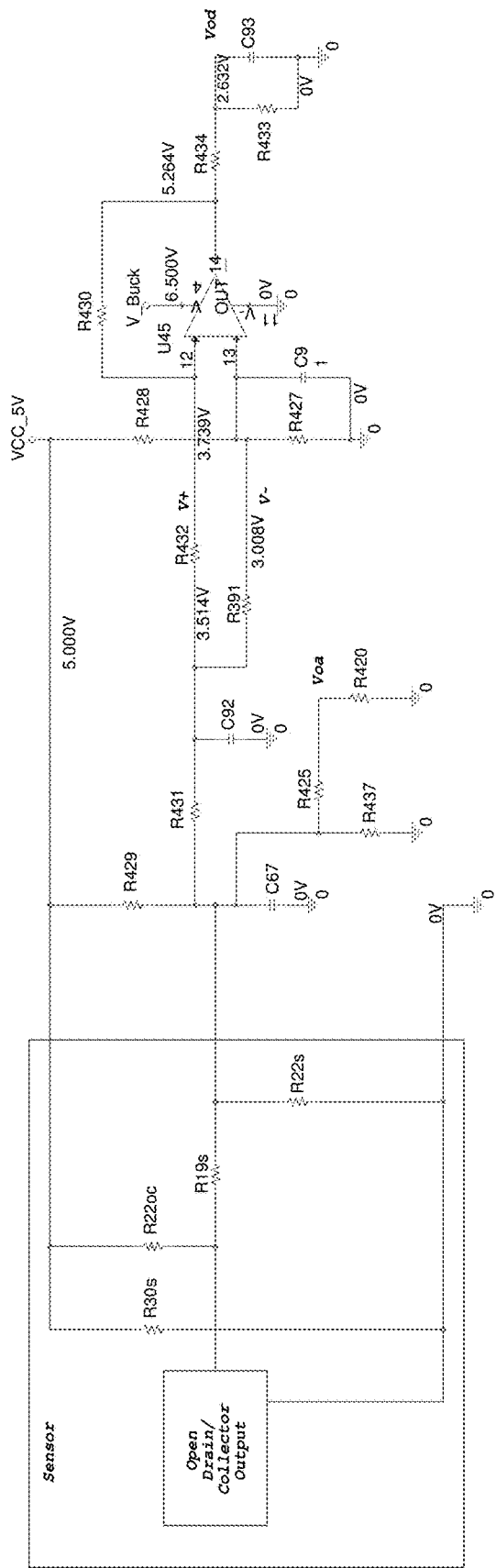
FIG. 5 is another schematic showing a circuit of the present invention, showing an open collector/drain sensor circuit with a variable frequency 50 percent duty cycle circuit.

As described herein, the present invention provides diagnostic services with the ability to detect a variety of fault conditions, including: open sensor power, signal and ground/return wire fault conditions. Such fault identification is achieved when unique voltage levels output from a diagnostic interface 10 coupled to a powered sensor 12 are read or processed by a microcontroller or electronic controller unit (ECU) 14 (FIG. 3). In an exemplary embodiment, a sensing system includes a powered sensor and a diagnostic interface circuitry that is coupled to the powered sensor and to an ECU. The diagnostic interface circuitry, via resistor bias networks between the powered sensor and the ECU, and responsive to fault conditions, produces a series of unique voltage levels (e.g., DC levels) that correspond to the fault and operating states of the powered sensor. For example, a particular fault or operating state of the powered sensor will have a unique, particular DC voltage level. Such unique DC voltage levels at an analog input to the ECU allow the ECU to diagnose a fault condition based upon the current DC level of the analog signal. Such fault conditions include open wire connections (i) to a voltage supply line of the DC powered sensor, (ii) to at least one communication signal line of the DC powered sensor, and (iii) to a power return line of the DC powered sensor. The DC level of the analog signal is also defined by series resistance, resistance to ground, and resistance to a voltage supply for the at least one communication signal line of the DC powered sensor.

In accordance with an aspect of the present invention, the unique steady-state voltage levels read by the ECU may be realized by a voltage divider bias network on the ECU and another voltage divider bias network on the powered sensor that also includes an additional series resistance between the powered sensor output and a wire harness. As described herein, a coordinated design of the ECU (microprocessor) and the powered sensor diagnostic interface (for a particular powered sensor) is needed to produce unique voltage levels for each fault and operating condition.

The present invention provides circuit interface topology and a method to diagnose three wire sensor for normal switching behavior, open supply voltage wire, open/series-resistive communication signal wire and open power supply return wire. This method distinguishes each failure in a unique voltage band at the controller unit connector pin to be diagnosed by the microprocessor through an analog input port for static and dynamic operating modes.

The typical solution uses a pull-up resistor on the input to the microprocessor controller unit and the sensor output makes connections to the return to communicate or its output switches from the supply voltage level to that of the return to communicate. The pull-up resistor makes the open signal wire easy to detect. Besides short to battery, other faults are difficult or impossible to uniquely detect depending on if there is a functional interpretation of the fault to aid in the diagnosis.

The diagnostic circuits of the present invention are capable to detect a series resistance fault. Without this, on such a fault the pulse width modulation (PWM) duty cycle containing the information from the sensor may be distorted resulting in a system malfunction. Bad data may then be interpreted as good. Also, when the motor is not in motion, the EMPSI/IPS sensor stops switching. This normal operating state could not be separated from an open supply or open return fault.

The present invention provides multiple solutions: Solution 1, PWM or Encoded Serial Data Sensor Signal using Push-pull Sensor Output. Solution 2, PWM or Encoded Serial Data Sensor Signal using Open Collector Sensor Output. Solution 3, 50 percent Duty Cycle Sensor Signal using Open Collector Sensor Output. Solution 4, 50 percent Duty Cycle Sensor Signal using Push-pull Sensor Output.

The present invention provides a voltage range based static and dynamic diagnostic interface that supports unique detection of open voltage supply, open sensor signal, open communication signal(s), series resistance in communication signal, fault resistance to ground and fault resistance to a voltage source. The present invention provides for enhanced warranty cost reduction, safety improvement and reliability competitive advantages.

Figure 1:
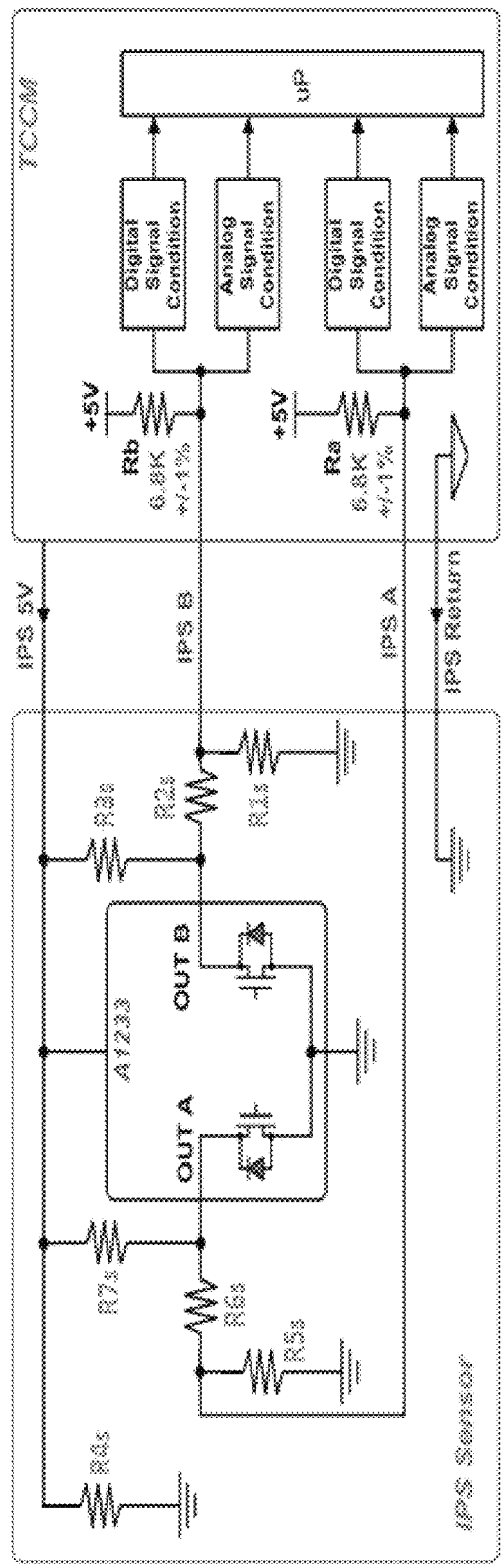
FIG. 1 is a block diagram showing a circuit with a variable frequency 50 percent duty cycle open-drain/collector output sensor in accordance with the present invention.
Figure 2:
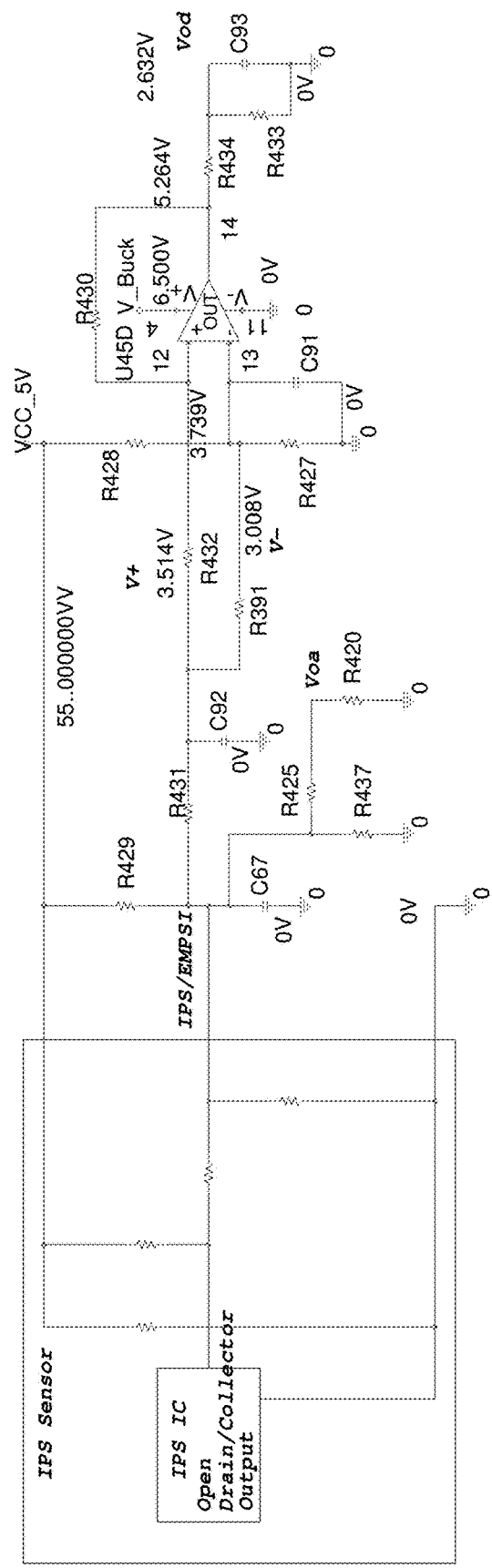
FIG. 2 is a schematic showing the circuit of the present invention, showing an open-drain/collector sensor circuit with a variable frequency 50 percent duty cycle circuit.

As shown in FIG. 1, showing an example implementation, the incremental position sensor (IPS) output is realized as a quadrature encoder, having two binary signal channels A and B signaling speed and direction. When channel A has the leading edge, the motor is turning in one direction. When channel B has the leading edge, the motor is turning in the opposite direction. The speed is determined or set by the pulse widths.

The diagnostic circuits of the present invention solve the task to diagnose open wire connections to the sensor on Power, Signal(s) and Return. The circuits also diagnose series resistance on signal wire, diagnose resistance to ground on signal wire, and/or diagnose resistance to voltage source on signal wire. Also, the digital interface portion of the circuit is designed to be fault tolerant to the point where the fault is un-mistakably identifiable.

For system diagnostics, and such as shown in the example implementation block diagram of FIG. 1, a circuit of the present invention is connected to the IPS A and B channel line and an additional 5 V supply and Ground line.

The intended function of the circuit of the present invention is to detect the failure causes or modes OPEN, Shortcut to Ground (S2G), shortcut to battery (S2B), Out of Range, Stuck and Drift in Range. By adapting the output circuitry, which is attached to sense pins of a microcomputer (configuring the digital and analog signal conditioning), the microcomputer algorithm of the present invention is able to state the failure modes:

Input Short to Battery Fault,
Input Out of Range High Fault,
Input Open Ground Return Fault,
Input Open Signal Fault,
Input Open 5 V Fault,
Input Short to Ground Fault,
Input Out of Range Low Fault,
Input Good Signal Criteria, High and Low operating states
Input Series Signal Resistance Fault,
Input Resistance to Ground Fault, and
Input Out of Range Low Fault.

FIGS. 2-5 show four exemplary circuit solutions in accordance with the present invention:

PWM or encoded Serial Data Sensor Signal using Push-pull Sensor Output.
PWM or encoded Serial Data Sensor Signal using Open Collector Sensor Output.
50% Duty Cycle Sensor Signal using Open Collector Sensor Output.
50% Duty Cycle Sensor Signal using Push-pull Sensor Output.

The example implementation EMPSI/IPS and RPS resistor values may be selected for the particular application. The impedance behavior of sensor IC when 5 V supply or ground (GND) is open will result in a partial voltage being present at the sensor IC's output. Back-feeding in the IC may cause impedances that effect the error band positions.

With proper structure and components parameter optimization, the system diagnostic capability can be dramatically enhanced. For example, the voltage at the analog input may be the same under the following three failure modes: open sensor connection, severe short to battery (regardless of the sensor output state), severe short to ground (regardless of the sensor output state). In accordance with an aspect of the present invention, with the sensor supply turned off, the voltage at the analog input may be distinctively different among the three failure modes, thus uniquely identifying the failure root cause without the need to rotate the motor. In accordance with a further aspect of the present invention, and such as discussed in detail below, the present invention also diagnoses between the three failure modes with a powered on sensor. Conventional diagnostic systems are not as fault tolerant and are therefore unable to provide these sensor diagnostics, whether powered or not.

Although discussed above as an IPS sensor application, the circuit of the present invention is applicable to any suitable sensor having power, ground and one or more communication signal outputs.

Optionally, a sensor may communicate data back to a controller by two or more voltage or current levels through a wiring harness that is subjected to extreme environmental conditions in a machine of some type. The challenge of this sensor communication is to receive the sensor data at the controller without misrepresentation. If damage to the wire harness or its connections effects the shape of the data signal from the sensor, the fault must be detectable in a range of the distortion so that the interface circuit can still extract the data within the timing constraints of the communication protocol.

Optionally, a system may use an interface from the sensor to the digital input of the microprocessor or state machine circuit that provides a threshold with hysteresis. See Schmitt trigger type circuits. The Schmitt trigger type of circuit can misrepresent the source signal (from a sensor) in a range where it may appear to be good within the measurement error of the diagnostic feedback sub-circuit to the controller.

The system of the present invention provides adaptive signal processing. There are two mechanisms in this concept—dynamic signal quality assessment and adaptive dynamic signal processing. The dynamic signal quality assessment provides a basic signal quality assessment that involves the measurement and processing of voltage level of logic "high" and logic "low". If the PWM signal logic level behavior is beyond normal expected range where the dynamic Signal Processing circuitry can guarantee proper signal processing, then the signal fault is called out. The adaptive dynamic signal processing circuitry dynamically adjusts itself to have the best and most reliable performance in detecting the signal. This includes, but is not limited to, dynamically adjusting logic low detection level to safely recognize logic low level signal, and dynamically adjusting logic high detection level to safely recognize logic high level signal. Both the dynamic signal quality assessment and the adaptive dynamic signal processing combined, along with proper digital signal processing, allows for the most tolerant and reliable PWM signal processing.

The system of the present invention provides advantages by desensitizing the controller input interface circuit to the effects of a resistance in series with the signal in the wiring harness, a resistance between the signal pin and/or ground/return, and a resistance between the signal pin and a voltage source. The system also reduces the sensitivity to the just described resistive faults in the wiring harness by amplifying the signal to shorten the time of the rise and fall slopes of the incoming sensor signal and to increase tolerance to a voltage offset.

The system improves fault detectability of open sensor wire fault using coordinated voltage divider networks on the sensor and controller input interface circuit. An offset bias between voltage dividers on both the sensor and controller input interface permits detection of a series resistance between the sensor and controller input interface circuit.

The system provides the ability for the ECU to detect open sensor Power, Signal and Ground/Return wire fault conditions with unique steady-state voltage levels read by the microprocessor through an analog input port. This is realized by a voltage divider bias network on the ECU and another one realized on the sensor that includes an additional series resistance between the sensor IC output and the wire harness. This capability is only realized by a coordinated design of the ECU and powered sensor interface. Otherwise, operational and fault voltage states are highly likely to overlap.

Resistance Fault Tolerant Digital Interface

The system of the present invention provides an analog to digital interface in the Electronic control unit (ECU) between a powered sensor that outputs its data encoded in the form of a Pulse Width Modulation signal (PWM), also known as a variable duty cycle signal, or a varying frequency at a fixed duty cycle. The signal generated by the sensor is two or three states. The third, optional, state is to transmit serial diagnostic information. The sensor output is considered to be analog in that the state voltage levels from the sensor do not include the supply voltage level or zero volts (ground/return).

The analog to digital interface consists of an amplifier and an offset reference supply circuit that is adjusted by the output of the amplifier to provide hysteresis.

One advantage of using an amplifier in the digital portion of the interface circuit is to make the interface tolerant to an offset caused by a fault in the wiring system of the machine that is manifested as a series resistance to the sensor communication signal, a resistance between the sensor signal and ground/return or a resistance between the sensor signal and a power node or ECU output. This advantage is realized by growing the signal in amplitude beyond the power supply voltage range of the amplifier. This allows the bias of the signal from the sensor to be shifted up or down while maintaining transitions between the supply rails at the output of the amplifier. This effect could be realized with a comparator.

Another advantage of using an amplifier in this interface circuit is to minimize error in the rise-to-fall/fall-to-rise/fall-to-fall/rise-to-rise edge-to-edge timing between the sensor and the microprocessor digital input port. This is accomplished by extending the sensor signal with gain beyond the power supply rails to cause only a small percentage of the rise and fall times to be output from the amplifier. This effect on the rise and fall times of the sensor signal reduces the effect of amplifier input filtering on the signal applied to the microprocessor digital input port. Optionally, this effect could be realized with a comparator.

Another advantage of using an amplifier in the interface circuit is to remove noise acquired on the sensor signal in the wiring harness without an RC filter at the input of the interface circuit. This is accomplished by extending the sensor signal with gain beyond the power supply rails to place the noisy portion of the signal outside the range of the output of the amplifier. This has the effect of clipping away the noisy portion of the sensor signal. The limitation is that if the noise riding on the signal is up to half the amplitude of the sensor signal or more, then the noise will be present as an out of range frequency at the digital port of the microprocessor. This abnormal operating condition is recognizable as an out-of-range or inconsistent frequency.

Powered Sensor Multiple Unique Faults Diagnostic Interface

The system separates sensor output operating states from open sensor wire fault states when the sensor communicates by voltage states, not current states. The sensor operating and fault states are:
  Sensor Output High State (Not sensor power rail voltage)
  Sensor Output Middle state (Optional)
  Sensor Output Low State (Not sensor ground/return voltage)
  Sensor Open Communication Signal Wire Fault
  Sensor Open Power Supply Positive Wire Fault
  Sensor Open Power Supply Negative/Ground/Return Wire Fault
  Other fault conditions could be interpreted if the sensor signal is switching.

Figure 6A:
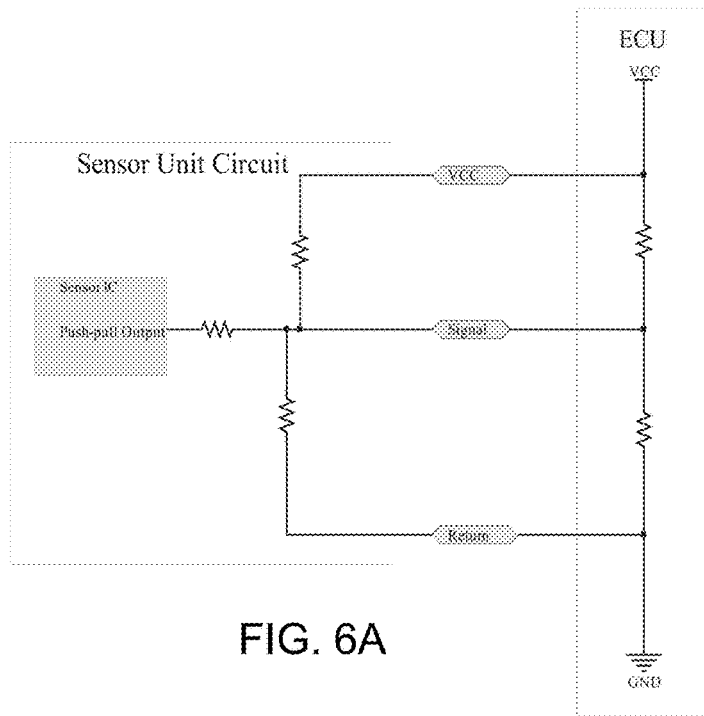
FIG. 6A is a schematic showing a push-pull output sensor and shows an example resistor configuration for use between the sensor IC output and its connector to the machine wire harness.
Figure 6B:
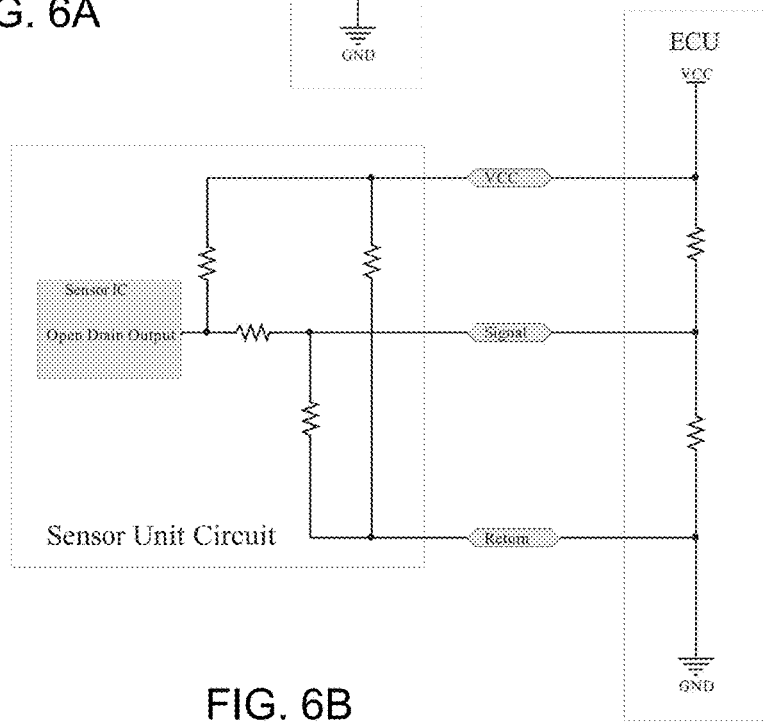
FIG. 6B is a schematic showing an open-drain/collector output sensor and shows an example resistor configuration for use between the sensor IC output and its connector to the machine wire harness.

The powered sensor IC outputs data by a push-pull or an open collector/drain interface. Additional components on the sensor circuit to provide series resistance between the sensor IC output and its connector to the machine wire harness and a voltage bias resistor network together with a voltage divider at the ECU input are required to realize this feature. The fault and operating states can only be separated by a coordinated resistor value selection, between the ECU and the sensor unit. Example resistor configurations are shown in FIGS. 6A and 6B.

The system realizes fault separation by the method of adding and subtracting resistances from a voltage divider. This can be demonstrated in explanation for a two output voltage state sensor. However, the system may include multiple current and voltage state sensors.

Figure 7:
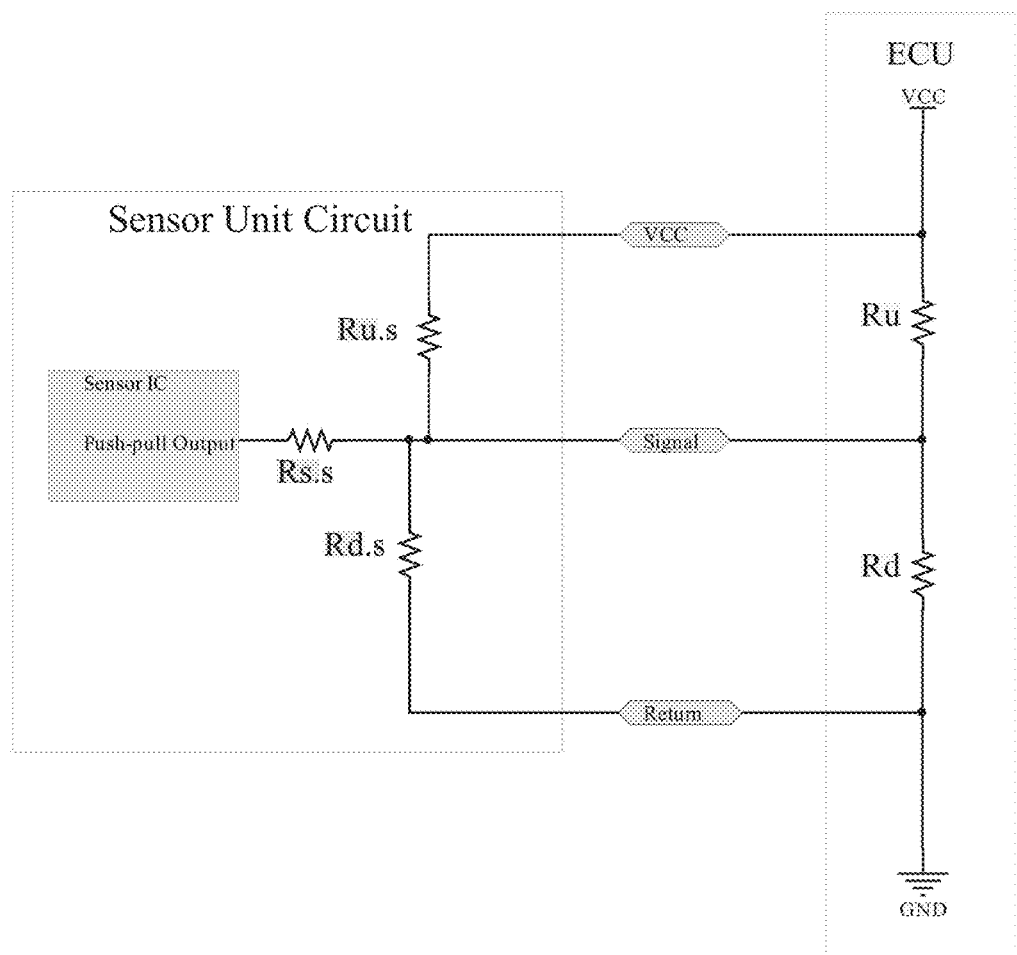
FIG. 7 is a schematic showing a two state sensor resistor ladder with push-pull sensor output.

An example of a Two State Sensor Resistor Ladder with Push-pull Sensor Output for Explanation is shown in FIG. 7. Note that each of the five states has a unique resistor combination.
  1. Sensor Output High State (Not sensor power rail voltage)
     Sensor operating state: On and output driving high to sensor supply voltage
     Parallel Pullup resistors: Rs.s, Ru.s, Ru
     Parallel Pull-down resistors: Rd.s, Rd
  2. Sensor Output Low State (Not sensor ground/return voltage)
     Sensor operating state: On and output driving low to sensor ground/return
     Parallel Pullup resistors: Ru.s, Ru
     Parallel Pull-down resistors: Rs.s, Rd.s, Rd 3. Sensor Open Communication Signal Wire Fault
   Sensor operating state: Off, unpowered, Output stage is high impedance
   Pullup resistor: Ru
   Pull-down resistor: Rd
4. Sensor Open Power Supply Positive Wire Fault
   Sensor operating state: Off, unpowered, Output stage is high impedance
   Pullup resistor: Ru
   Parallel Pull-down resistors: Rd.s, Rd
5. Sensor Open Power Supply Negative/Ground/Return Wire Fault
   Sensor operating state: Off, unpowered, Output stage is high impedance
   Parallel Pullup resistors: Ru.s, Ru
   Pull-down resistor: Rd Example Implementation 1: PWM Signal Sensor with Two-Level Push-Pull Output Type Sensor IC The invention as realized in the schematic of FIG. 9 represents a solution for a PWM sensor whose IC drives with a push-pull output.

Figure 9:
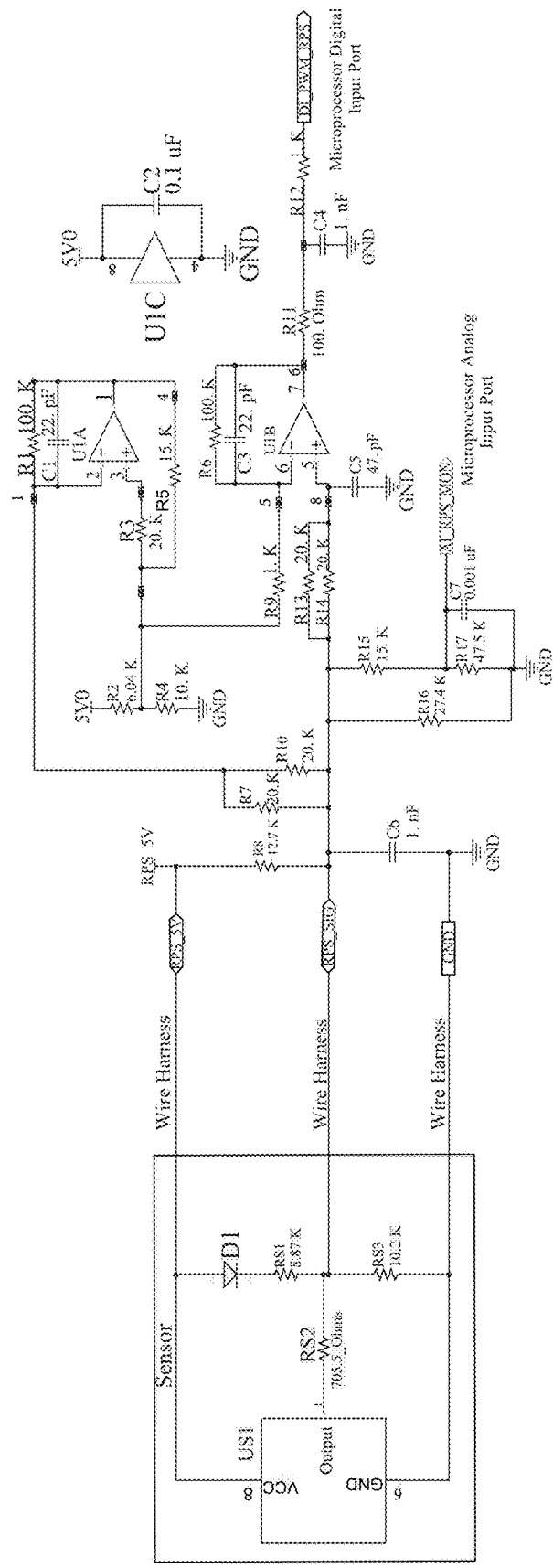
FIG. 9 is a schematic that represents a solution for a PWM sensor whose IC drives with a push-pull output.

The sensor output stage is depicted without components in FIG. 9 that are the design discretion of the sensor supplier with the exception of D1. RS1, RS2 and RS3 represent resistors that are part of the fault and drive state separation resistance network. D1 is left in the schematic to discuss the effect of a diode in series with resistors intended to set drive voltage levels applied to the ECU input interface circuit to unique fault voltage levels that are observable by the microprocessor through the analog input port. The presence of diode D1 will affect the fault and driven voltage states and is included in the analysis model to determine the value of RS1. The forward voltage drop on D1 will offset the voltage across RS1. The system may include such components in series or parallel with the drive state and fault resistors (RS1, RS2 and RS3) and may include such sub-circuits to add protection and features to the output sensor interface. This does not define a new variant of the invention, but is within the scope of it. The modifications to the fault and drive state separation resistance network are considered in the sizing of the resistors to achieve the state/fault voltage separation.

Figure 8:
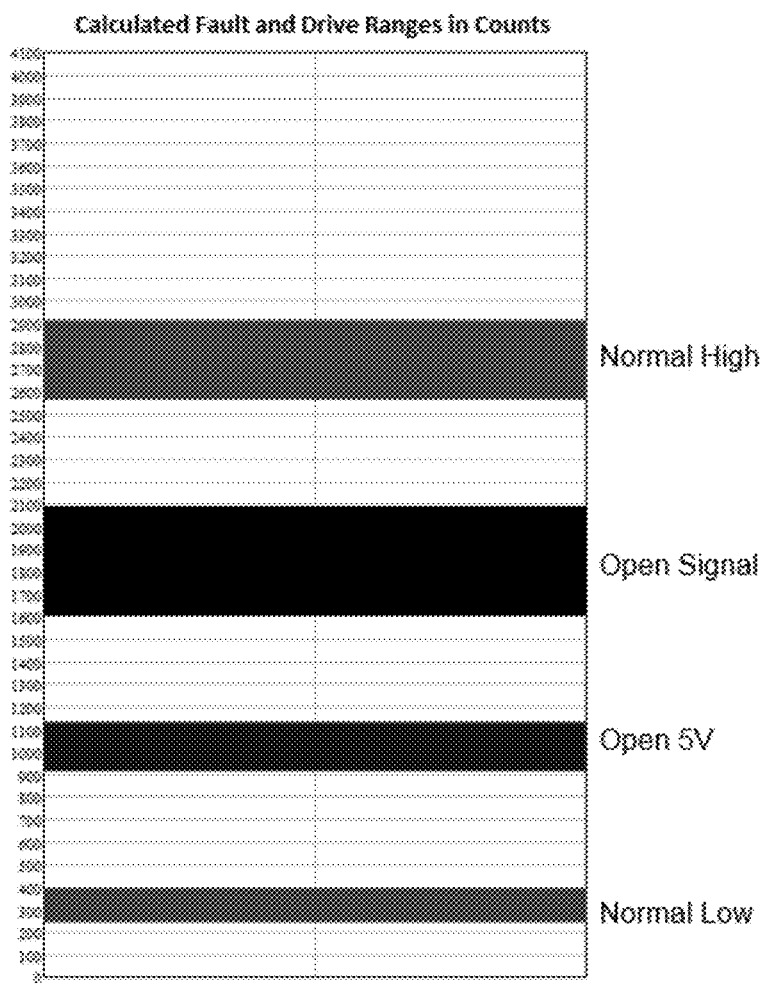
FIG. 8 is a chart showing an example of calculated fault and drive ranges in counts for a push-pull output sensor.

The sensor output characteristics and type will affect the ability to isolate open sensor supply, open sensor signal and open sensor return/GND. Some sensors use depletion-mode drive stages (such as MOS Field Effect Transistors or MOSFETs that turn-on when denied gate voltage) on their communication line. This would interfere with successful implementation of this feature of the system of the present invention. This issue was encountered in the implementation of the circuit in FIG. 9. The open return/GND fault detection could not be separated from the drive high voltage range. An example of the voltage state separation, as analog-to-digital converter counts, achieved in this implementation of the invention is shown in FIG. 8.

On the ECU input side of the circuit in FIG. 9, resistor R8 in parallel with all other input impedances to the 5 V supply represents the equivalent pull-up resistance of the fault and drive state separation resistance network. R16 in parallel with all other input impedances to the sensor return/GND represents the equivalent pull-down resistance of the fault and drive state separation resistance network.

Components comprising the input filtering in FIG. 9 are C6 and a filter in the non-inverting amplifier circuit, R13, R14 and C5. C6 performs the function of a filter by shunting high frequencies to the battery return. R13, R14 and C5 form a high frequency low-pass filter.

Components comprising the non-inverting amplifier in FIG. 9 are R9, R13, R14, C5, U1B, R6 and C3. This amplifier provides tolerance to an offset on the sensor signal by amplifying the sensor signal.

Components comprising the reference and inverting hysteresis amplifier in FIG. 9 are R7, R10, R1, C1, U1A, R3, R5, R2 and R4. This amplifier inverts the signal to apply negative hysteresis to the non-inverting amplifier. This amplifier must have the same gain as the non-inverting amplifier to be similarly tolerant to an offset on the sensor signal.

Components comprising the non-inverting amplifier output filter and current limiting circuit to the microprocessor digital port in FIG. 9 are R11, C4, and R12. A filter is added to the output of the amplifier to remove high frequency toggling of the non-inverting amplifier during transition. The filter is after the amplifier so as to not be a load on the interface input and to make the circuit more tolerant to a series resistance in the wire harness. An additional series resistor was added to drop a portion of the output voltage across since this example circuit was connected to a 3.3 V microprocessor port.

Components comprising the analog monitoring circuit in FIG. 9 are R15, R17 and C7. This is the primary source of diagnostic data about the health of the sensor information. The voltage divider is scaled to about 6.5 V for increased voltage accuracy. The filtering is low, at a higher corner frequency, to facilitate measurement of the high and low sensor voltage states.

Figure 10:
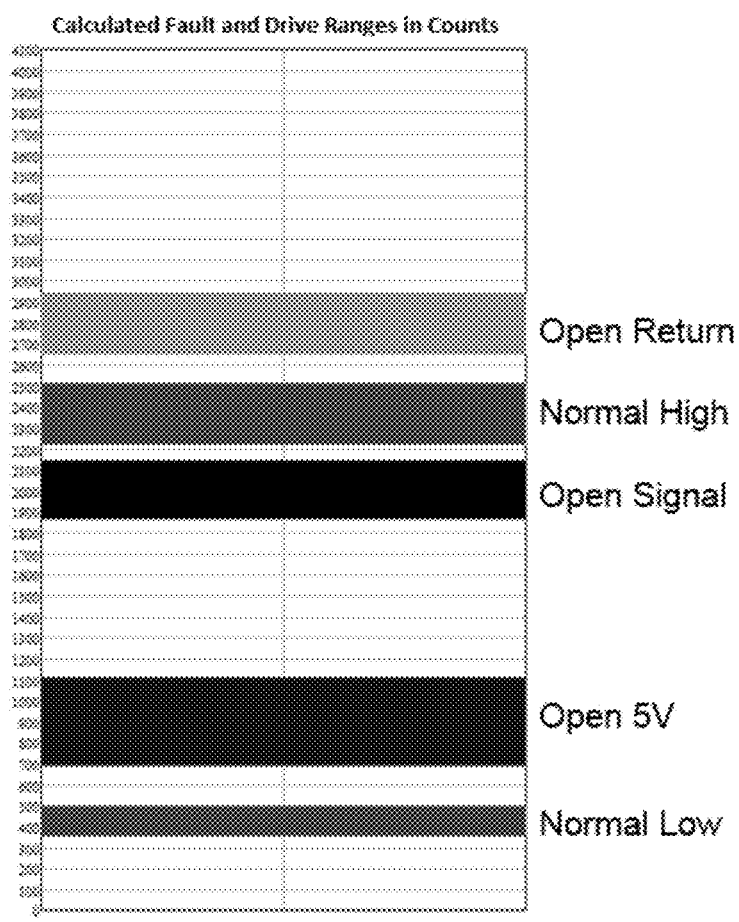
FIG. 10 is a chart showing an example of a voltage state separation, as analog-to-digital converter counts for an open-drain/collector output sensor.

Example Implementation 2: Frequency Signal Sensor with Open-Collector/Drain Output Type Sensor IC The sensor output circuit in FIG. 11 comprises a sensor whose output is an open drain type. Resistors RS1, RS2 and RS3 comprise the sensor portion of the fault and drive state separation resistance network. Some sensors use depletion-mode drive stages (MOSFETs that turn-on when denied gate voltage) on their communication line. This would interfere with successful implementation of this feature of the invention. This issue was not encountered in the implementation of the circuit in FIG. 11. An example of the voltage state separation, as analog-to-digital converter counts, achieved in this implementation of the invention is shown in FIG. 10.

Figure 11:
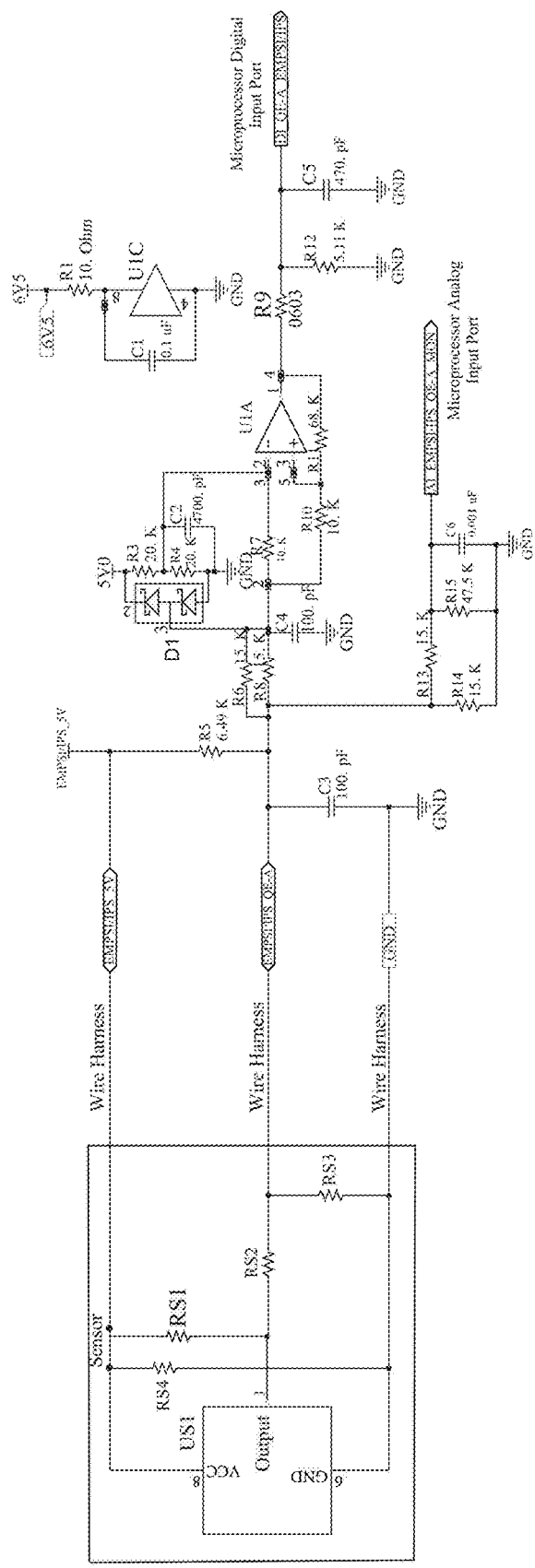
FIG. 11 is a schematic of a sensor output circuit comprising a variable frequency with 50 percent duty cycle sensor with an open-drain/collector type output.

On the ECU input side of the circuit in FIG. 11, resistor R5 in parallel with all other input impedances to the 5 V supply represents the equivalent pull-up resistance of the fault and drive state separation resistance network. Resistor R14 in parallel with all other input impedances to the sensor return/GND represents the equivalent pull-down resistance of the fault and drive state separation resistance network.

Components comprising the input filtering in FIG. 11 are C3, R6, R8 and C4. C3 performs the function of a filter by shunting high frequencies to the battery return. R6 in parallel with R8 and C4 for a low pass filter.

Components comprising the inverting amplifier in FIG. 11 are R7, R10, R11 and U1A. This amplifier provides tolerance to an offset on the sensor signal by amplifying the sensor signal.

Components comprising the voltage reference in FIG. 11 are R3, R4, R7 and C2. A simple voltage divider (R3 and R4) establishes a reference voltage. The sensor signal shifts the voltage reference through R7 to provide hysteresis.

Components comprising the non-inverting amplifier output filter and current limiting circuit to the microprocessor digital port in FIG. 11 are R9, R12 and C5.

Components comprising the analog monitoring circuit in FIG. 11 are R13, R15 and C6. This is the primary source of diagnostic data about the health of the sensor information. The voltage divider is scaled to about 6.5 V for increased voltage accuracy. The filtering is low, at a higher corner frequency, to facilitate measurement of the high and low sensor voltage states.

In FIG. 11, a diode pair, D1 is added to protect the input of the amplifier from high voltages from a short to another wire in the harness.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A sensing system comprising:
a powered sensor;
a diagnostic interface circuitry coupled to the powered sensor and operable to generate an analog signal having a DC level defined in part by fault conditions of the powered sensor, the fault conditions including open wire connections (i) to a voltage supply line of the powered sensor, (ii) to at least one communication signal line of the powered sensor, and (iii) to a power return line of the powered sensor;
wherein the DC level of the analog signal is also defined in part by series resistance, resistance to ground, and resistance to a voltage supply for the at least one communication signal line of the powered sensor;
wherein the powered sensor is coupled to an electronic control unit via the diagnostic interface circuitry;
wherein, responsive to receiving the analog signal, the electronic control unit diagnoses a fault as defined by the DC level of the analog signal, the fault comprising at least one of the fault conditions; and
wherein the DC level at an analog input is not the same for each of an open sensor connection failure mode, a severe short to battery failure mode and a severe short to ground failure mode.

2. The sensing system of claim 1, wherein a first particular fault is identified when the DC level of the analog signal lies within a first range of DC levels defined by an upper threshold and a lower threshold for the first particular fault.

3. The sensing system of claim 2, wherein a second particular fault is identified when the DC level of the analog signal lies within a second range of DC levels that does not lie within the first range of DC levels.

4. The sensing system of claim 1, wherein each unique fault condition of the powered sensor produces a unique range of DC levels in the diagnostic interface circuitry that is outside of the DC level ranges associated with any other fault condition.

5. The sensing system of claim 1, wherein the powered sensor comprises one of an open drain/collector sensor output and a push-pull sensor output.

6. The sensing system of claim 1, wherein the electronic control unit comprises a voltage divider bias network, and wherein the powered sensor comprises a voltage divider bias network and an additional series resistance between an output of the powered sensor and a wire harness coupled to the powered sensor, and wherein the diagnostic interface circuitry is coupled to the powered sensor via the wire harness.

7. A sensing system comprising:
a powered sensor;
a diagnostic interface circuitry coupled to the powered sensor and operable to generate an analog signal having a DC level defined in part by fault conditions of the powered sensor, the fault conditions including open wire connections (i) to a voltage supply line of the powered sensor, (ii) to at least one communication signal line of the powered sensor, and (iii) to a power return line of the powered sensor;
wherein the diagnostic interface circuitry comprises a voltage range based static and dynamic diagnostic interface for the powered sensor;
wherein the DC level of the analog signal is also defined in part by series resistance, resistance to ground, and resistance to a voltage supply for the at least one communication signal line of the powered sensor;
wherein the powered sensor is coupled to an electronic control unit via the diagnostic interface circuitry;
wherein, responsive to receiving the analog signal, the electronic control unit diagnoses a fault as defined by the DC level of the analog signal, the fault comprising at least one of the fault conditions; and
wherein the DC level at an analog input is not the same for each of an open sensor connection failure mode, a severe short to battery failure mode and a severe short to ground failure mode.

8. The sensing system of claim 7, wherein a first particular fault is identified when the DC level of the analog signal lies within a first range of DC levels defined by an upper threshold and a lower threshold for the particular fault, and wherein a second particular fault is identified when the DC level of the analog signal lies within a second range of DC levels that does not lie within the first range of DC levels.

9. The sensing system of claim 7, wherein the powered sensor comprises one of an open drain/collector sensor output or a push-pull sensor output.

10. The sensing system of claim 7, wherein the electronic control unit comprises a voltage divider bias network, wherein the powered sensor comprises a voltage divider bias network, and an additional series resistance between an output of the powered sensor and a wire harness coupled to the powered sensor, and wherein the diagnostic interface circuitry is coupled to the powered sensor via the wire harness.

11. A sensing system comprising:
a DC powered sensor;
circuitry comprising a voltage range based static and dynamic diagnostic interface for the DC powered sensor;
wherein the circuitry is operable to generate an analog signal having a DC level defined in part by fault conditions of the DC power sensor, the fault conditions including open wire connections (i) to a voltage supply line of the DC powered sensor, (ii) to at least one communication signal line of the DC powered sensor, and (iii) to a power return line of the DC powered sensor;
wherein the analog signal is also defined in part by series resistance, resistance to ground, and resistance to a voltage supply for the at least one communication signal line of the DC powered sensor;

wherein the circuitry comprises a fault tolerant interface between a wire harness at an output of the DC powered sensor and a digital input port of a microprocessor;

wherein, responsive to receiving the analog signal, the microprocessor diagnoses a fault as defined by the DC level of the analog signal, the fault comprising at least one of the fault conditions; and wherein the DC voltage at an analog input is not the same for each of an open sensor connection failure mode, a severe short to battery failure mode and a severe short to ground failure mode.

12. The sensing system of claim 11, wherein, with the DC powered sensor powered on, the DC voltage at the analog input is distinctively different for each of the three failure modes.

13. The sensing system of claim 12, wherein the sensing system is operable to identify each of the three failure modes with the DC powered sensor powered on.

14. The sensing system of claim 11, wherein the sensing system comprises PWM or Encoded Serial Data Sensor Signals and Push-pull Sensor Output.

15. The sensing system of claim 11, wherein the sensing system comprises PWM or Encoded Serial Data Sensor Signals and Open Collector Sensor Output.

16. The sensing system of claim 11, wherein the sensing system comprises 50 percent Duty Cycle Sensor Signals and Open Collector Sensor Output.

17. The sensing system of claim 11, wherein the sensing system comprises 50 percent Duty Cycle Sensor Signals and Push-pull Sensor Output.

18. The sensing system of claim 11, wherein component and parameter values of the circuitry are dependent upon input impedance requirements of the input port of the microprocessor and/or output impedance requirements of the DC powered sensor output.

19. The sensing system of claim 18, wherein the component and parameter values of the circuitry comprise resistance values for a resistor network of the circuitry.

* * * * *

UNITED STATES PATENT AND TRADEMARK OFFICE
CERTIFICATE OF CORRECTION

PATENT NO. : 10,215,799 B2  
APPLICATION NO. : 15/405636  
DATED : February 26, 2019  
INVENTOR(S) : Roger T. Douglas et al.

It is certified that error appears in the above-identified patent and that said Letters Patent is hereby corrected as shown below:

On the Title Page

Item (54) and in the Specification, Column 1, Line 1, title:
"DIAGNOSITC" should be --DIAGNOSTIC--

Signed and Sealed this
Second Day of April, 2019

Andrei Iancu
*Director of the United States Patent and Trademark Office*